United States Patent [19]

Ito

[11] Patent Number: 4,520,425

[45] Date of Patent: May 28, 1985

[54] CONTROL APPARATUS WITH IMPROVED STRUCTURE FOR COOLING CIRCUIT ELEMENTS

[75] Inventor: Eizi Ito, Komaki, Japan

[73] Assignee: Mitsubishi Denki Kabushiki Kaisha, Tokyo, Japan

[21] Appl. No.: 521,917

[22] Filed: Aug. 10, 1983

[30] Foreign Application Priority Data

Aug. 12, 1982 [JP] Japan .................................. 57-122710
Aug. 12, 1982 [JP] Japan .................................. 57-122712

[51] Int. Cl.³ .............................................. H05K 7/20
[52] U.S. Cl. ...................................... 361/384; 361/386; 361/399; 165/80 B
[58] Field of Search ............... 361/395, 399, 386, 387, 361/388, 381–384; 174/15 R, 16 R, 16 HS; 165/80 B, 80 D, 185, 104.33; 357/81, 82; 363/141

[56] References Cited

U.S. PATENT DOCUMENTS

| | | | |
|---|---|---|---|
| 3,305,704 | 2/1967 | Battista | 361/384 |
| 3,993,123 | 11/1976 | Chu | 357/82 |
| 4,126,269 | 11/1978 | Bruges | 361/384 |
| 4,459,638 | 7/1984 | Brehm | 357/82 |

FOREIGN PATENT DOCUMENTS 1046199 12/1958 Fed. Rep. of Germany ...... 361/384

Primary Examiner—G. P. Tolin
Attorney, Agent, or Firm—Wenderoth, Lind & Ponack

[57] ABSTRACT

A control apparatus such as an inverter includes a hollow body having generally a rectangular cross-section, composed of sides of sheet metal with upper and lower open ends shielded by cast hollow frames, each having a similar cross-section. Electrical circuit elements are mounted to one of the sides of the hollow body through an opening therein. Ventilating fans are mounted to at least one of the hollow frames for cooling the electrical circuit elements.

9 Claims, 9 Drawing Figures

CONTROL APPARATUS WITH IMPROVED STRUCTURE FOR COOLING CIRCUIT ELEMENTS

BACKGROUND OF THE INVENTION

The present invention relates to a control apparatus for inverters, etc. and more particularly to the construction of a housing thereof.

In general, electrical circuit elements forming an inverter apparatus include elements for a main circuit and elements for a control circuit. The amount of heat generated from diodes, thyristers, transister modules, etc. as the elements of the main circuit is relativley large.

In the case of machinery having a large capacity the degree of heat loss can be as high as about 1 kW. Therefore, it is necessary to dissipate the generated heat through die cast fins of aluminum so as to be able to use the diodes, thyristors, transistor elements, etc. in their normal manner, and at the same time so as not to subject electronic elements of the control circuit provided on a printed circuit board to the effects of temperature thereby lengthening the life of the elements and increasing their reliability.

An example of an inverter as a conventional control apparatus of this type is shown in FIGS. 1 to 3 of the attached drawings. Within a chassis 2 of a control apparatus 1 having generally a rectangular cross-section are secured fins 4 of an aluminum die cast product. Fins 4 have mounted thereon semiconductor elements 3 for a main circuit, and are adapted to dissipate heat generated from semiconductor elements 3. For this purpose a fan 5 is mounted inside chassis 2 below radiating fins 4. Other elements 6 constituting circuits are also mounted within chassis 2. A panel 8 is hinged to chassis 2 by hinges 7 located at the upper and lower side portions, as viewed in FIG. 1 of the chassis so as to be opened and closed. A printed circuit board 9 is mounted on panel 8 by means of insulating spacers 10. The above described elements are wired together according to particular circuit diagrams.

Upon operation of the inverter apparatus, main circuit electrical elements 3 generate heat that is transferred to radiating fins 4, the temperature of which is raised. However, due to the fan 5 located below fins 4, air passes through and strikes the fins. Thus, the temperature of the fins is lowered and the semiconductor elements 3 for the main electrical circuit are maintained within a predetermined temperature range. However, in this case a problem arises involving the external dimension of the chassis or housing 2 required to contain the apparatus, i.e. to provide the necessary internal volume of the housing. The inner volume of the housing must be sufficiently large for the heat generated from the inventor apparatus as a whole to dissipate naturally through the outer surface of the housing so that the temperature within the housing is maintained within the predetermined temperature range of the components. However, in this conventional apparatus, since the housing is formed as stated above, when it is necessary to have the external dimension of the housing made large, it also is necessary to fabricate all of the housing components anew. Therefore, this has the disadvantages of making standardization of fabrication difficult. Further, since the heated air circulated by fan 5 imparts thermal effects to main circuit components 3 and other elements 6, the life and reliability thereof are decreased.

SUMMARY OF THE INVENTION

It is an object of the present invention to provide a control apparatus which has an improved cooling arrangement in order to effectively dissipate the heat generated from the electrical circuit components.

It is another object of the present invention to provide a control apparatus which will not subject the other electrical circuit elements to heat by separately forming a passage for the heated air.

It is a further object of the present invention to provide a control apparatus which can prolong the life of the electrical circuit components and increased their reliability.

It is a still further object of the present invention to provide a control apparatus which is easy to assemble and which standardization of fabrication.

In accordance with the present invention a control apparatus includes a chassis formed from sides made of sheet metal so as to have generally a rectangular cross-section with top and bottom ends being closed by die cast hollow frames having cross-sections similar to that of the chassis. Electrical current elements are mounted to one of the sides of the chassis so as to be located within an opening formed therein, and a ventilating fan is provided within at least one of the frames so as to ventilate and cool the electrical circuit elements.

According to one of the preferred features of the present invention the electfical circuit elements are mounted on radiating fins which are secured to the side of the chassis so as to close the opening formed therein.

BRIEF DESCRIPTION OF THE DRAWINGS

These and other objects of the present invention will become more readily apparent from the following specification, with reference to the accompanying drawings, in which.

DESCRIPTION OF THE PREFERRED EMBODIMENTS

Figure 1:
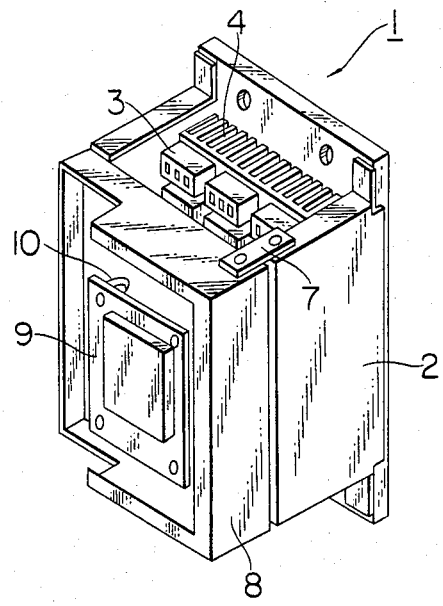
FIG. 1 is a perspective view of a conventional inverter apparatus.
Figure 2:
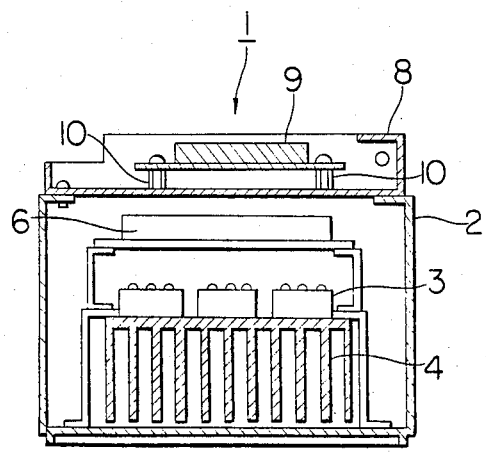
FIG. 2 is a cross sectional plan view of the apparatus shown in FIG. 1.
Figure 3:
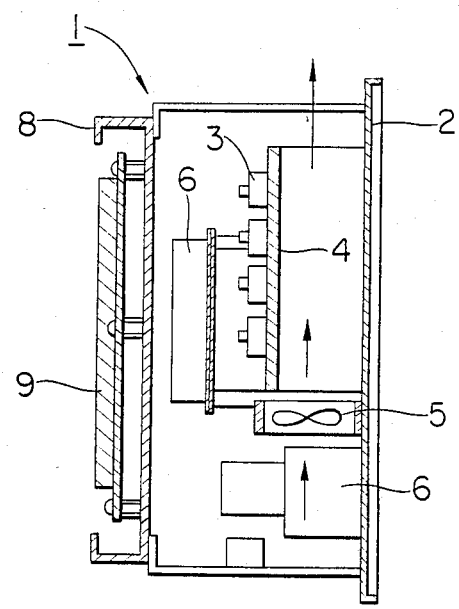
FIG. 3 is a longitudinal side sectional view of the apparatus shown in FIG. 1.
Figure 4:
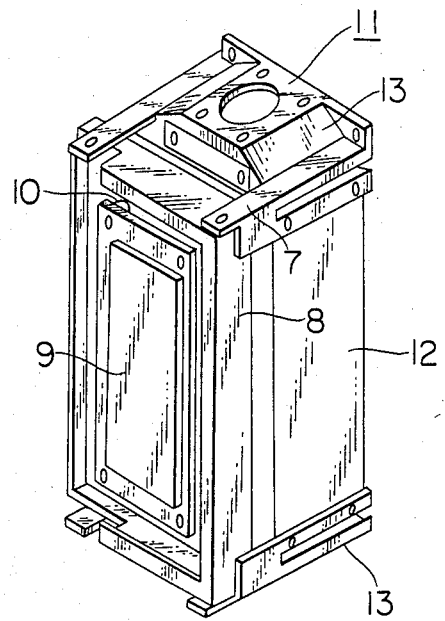
FIG. 4 is a perspective view of one embodiment of the present invention.
Figure 6:
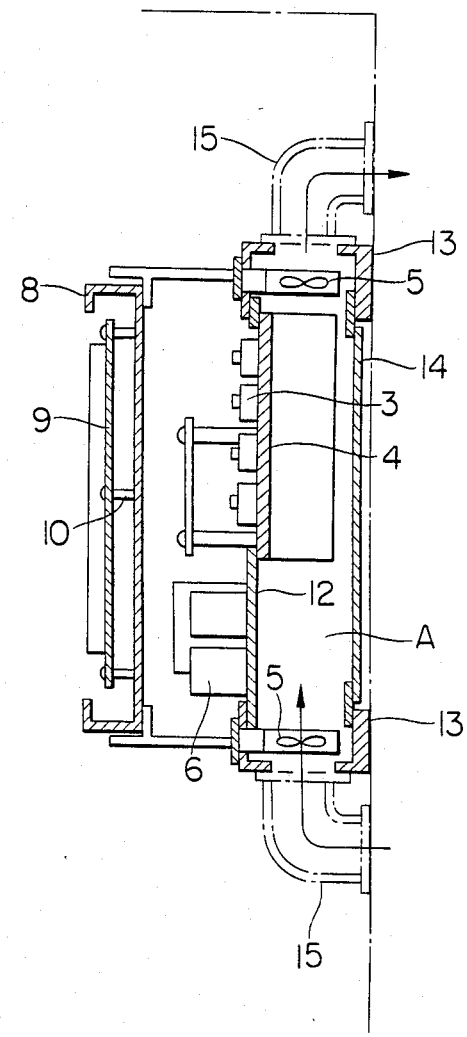
FIG. 6 is a partial longitudinal view of the embodiment shown in FIG. 4 on an enlarged scale.
Figure 5:
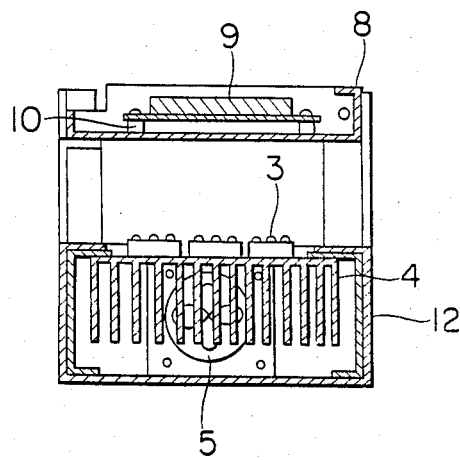
FIG. 5 is a cross sectional plan view of the embodiment shown in FIG. 4.
Figure 7:
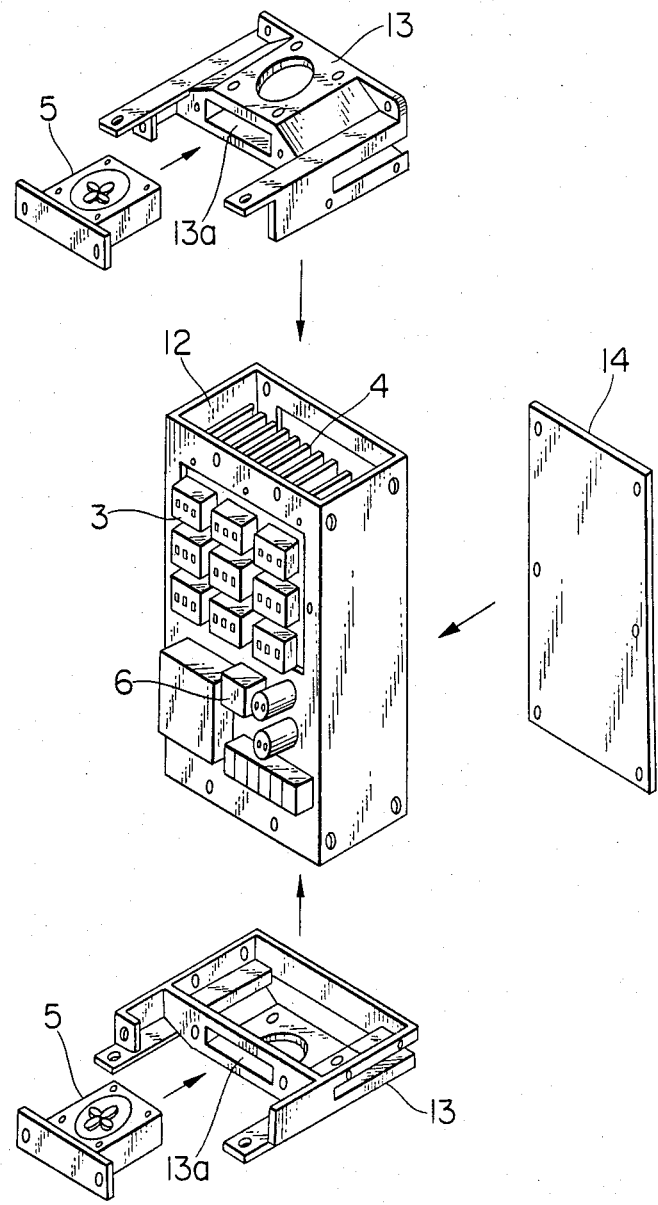
FIG. 7 is an exploded perspective view of the embodiment shown in FIG. 4.

Referring now to FIGS. 4 to 7 of the attached drawings illustrating an embodiment of the present invention, a hollow chassis 12 of a control apparatus 11 has fins 4 secured thereto inside thereof to cause heat generated from the electrical elements 3 for the main circuit (hereinafter referred to as "semiconductor elements"), comprised of semiconductor elements to be dissipated. Fins 4 are of a die cast product of aluminum, and semiconductor elements 3 are mounted thereon.

In this case, chassis 12 has a rectangular cross-section and is provided with a rectangular opening in one of its side surfaces, the size of which opening is somewhat larger than the external dimensions of semiconductor elements 3. Radiating fins 4 are mounted on to the rear surface of one of the sides of chassis 12 and do not project past the front surface thereof. Cast frames 13 (e.g. made by an aluminum die cast process, each having generally a flat tropezoidal configuration with a base portion having a cross-section similar to that of chassis 12, fit to the open top and bottom ends of chassis 12 so as to be releasably secure thereto by such as screws. Introduced into a central rectangular opening 13a formed in each of frames 13, in an inner vertical wall thereof is a fan 5 which is mounted on a mounting board to be secured thereto. Elements 6 constituting the other electrical circuit are mounted to chassis 12 on the front surface of the side to which fins 4 are mounted. An openable and closeable panel 8 is hinged to posts projecting forwardly from the right of upper and lower frames 13 by hinges 7. Panel 8 has mounted thereon a printed circuit board 9 by means of insulating spacers 10. On the basis of circuit diagrams the various components described above are appropriately wired together. A back plate 14 is fixed to chassis 12.

Upon operation of the inverter apparatus, semiconductor elements 3 of the main electrical circuit generate heat to be conducted to radiating fins 4, thus raising the temperature of the fins. However, due to the passage of air by ventilation fans 5, the temperature of fins 4 is lowered so that the normal characteristics of main electrical circuit components 3 are maintained. In this case, the ventilating air flows passes through a wind channel A (see FIG. 6) defined by upper and lower frames 13 as well as the sides of rectangular chassis 12. Thus, the heated air does not impinge upon the other components. Due to the fact that radiating fins 4 which holds almost all of the generated heat are mounted in wind channel A and are shielded from the other components, even if ducts 15 are connected to flange portions of upper and lower frames 13 so that the outside air is passed through ducts 15 to ventilate wind channel A, the ventilating air impinges only upon fins 4 within wind channel A, without impinging upon the other electrical components. Thus, the other components are not subjected to thermal effects. In a case where the control apparatus is to be used in adverse environments, such as those where there is a suspended oil mist or where there is much dust, etc., the air flows only within wind channel A, making it possible to cool radiating fins 4, but to allow the electrical components of the other control circuits and the main electrical circuit to be operated without being struck by the dirty air outside chassis 12, so that an inverter apparatus having a long life and high reliability can be realized.

From the foregoing it will be appreciated that chassis 12 in accordance with the present invention may be formed of sheet metal members constituting its sides and cast members constituting upper and lower frames 13 detachably secured to the sheet metal members to form the upper and lower ends of chassis 12. Thus, even if it is necessary to make chassis 12 larger according to the capacity of a particular inverter apparatus, this can be achieved easily merely by forming sheet metal sides of greater height dimension, without changing the cross sectional shape and dimensions of chassis 12 and of cast frames 13. Thereby frames 13 which constitute the upper and lower ends of chassis 12 can be commonly utilized for any capacity inverter apparatus.

Thus, the present invention can contribute to the standardization of production of inverter apparatuses.

In addition, the formation of the upper and lower ends of chassis 12 from cast frames 13 strengthens chassis 12 and also facilitates the mounting of cooling fans 5.

Figure 8:
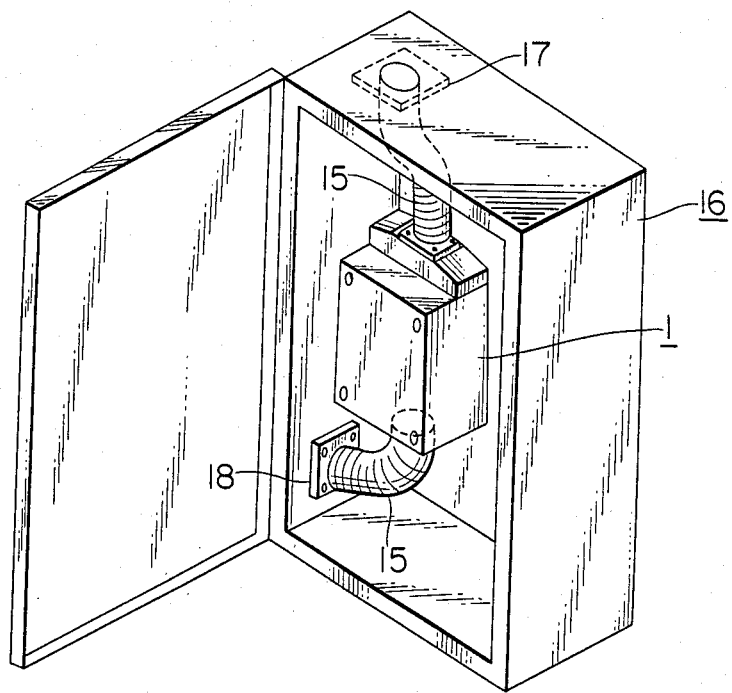
FIGS. 8 and 9 are partial perspective views of other embodiments of the present invention.

FIG. 8 is an embodiment that indicates the state of mounting of the inverter apparatus to a control housing 16 wherein flexible pipes or ducts 15 are connected between the wind channel of the inverter apparatus 1 and a suction port 18 and a discharge port 17 formed in control housing 16. The other members are identical to those in the prior art.

Figure 9:
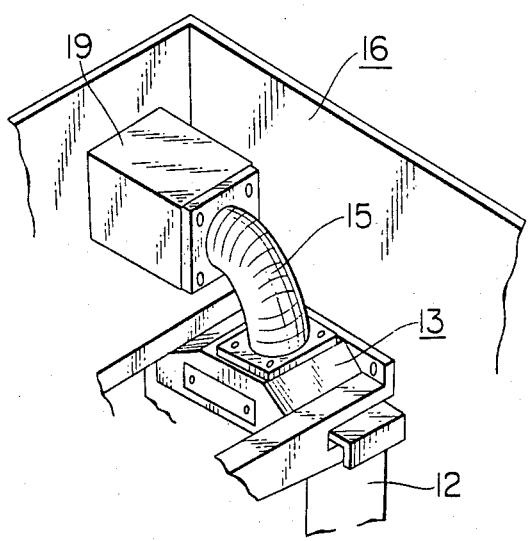

FIG. 9 shows a further embodiment of the present invention wherein a flexible pipe or duct 15 and a duct connecting member 19 having a hollow square cross-section is connected between the wind channel of the body 1 of an inverter apparatus and the suction or discharge port of the control housing 16. There are two methods of connecting the flange portion of the chassis 12 of inverter apparatus 1 with the suction or discharge port of the control housing 16, i.e. the orthogonally up and down direction and the rear side horizontal direction in which the direction is diverted at 90° by connecting flexible pipe 15. Therefore, there are four combinations when the connections at the upper and lower parts are considered.

In this embodiment, as described above, since flexible pipe 15 is used to connect the wind channel of chassis 12 of inverter apparatus 11 to the suction or discharge port of control housing 16, there is flexibility in the relationship between their mounting positions, without the need of preparing connecting pipes having various shapes which are appropriate for a particular mounting state of the inverter apparatus as hitherto has been usual. Thus, design and production become easier and standardization of production can be realized.

Although the present invention has been explained and indicated above as being embodied in an inverter apparatus, it should be noted that the present invention can also be similar applicable to other control apparatuses in which there are large amounts of heat generated by semiconductor elements such as transistors, thyristors, etc.

It is to be understood that although certain forms of the present invention have been illustrated and described, the invention is not to be limited thereto except insofar as such limitations are included in the following claims.

What is claimed is:

1. A control apparatus comprising:
    a chassis having a generally rectangular cross section defined by side members and having open opposite ends, one said side member having therein an opening;
    electrical circuit members mounted on said chassis and extending through said opening in said one side member thereof;
    heat dissipating means, mounted on the inner surface of said one side member and closing said opening therein, for dissipating into the interior of said chassis heat generated by said electrical circuit members;
    said chassis defining through said interior thereof a single air channel isolated from direct contact with said electrical circuit elements;

frames fitting over said opposite ends of said chassis; and ventilating means, mounted in at least one said frame, for directing through said single air channel a flow of air, thereby to cool said heat dissipating means, and indirectly to cool said electrical circuit members.

2. An apparatus as claimed in claim 1, wherein said side members comprise sheet metal members.

3. An apparatus as claimed in claim 1, wherein said frames comprise cast metal members.

4. An apparatus as claimed in claim 1, wherein said ventilating means comprises at least one fan.

5. An apparatus as claimed in claim 1, wherein said ventilating means comprises a pair of fans, one each mounted in a respective said frame.

6. An apparatus as claimed in claim 1, wherein said heat dissipating means comprises a member closing said opening and including fins extending into said air channel.

7. An apparatus as claimed in claim 6, wherein said electrical circuit members are mounted on said dissipating element.

8. An apparatus as claimed in claim 1, further comprising a control housing receiving therein said chassis and having suction and discharge ports, and flexible ducts connecting said ports to respective ends of said air channel through said frames.

9. An apparatus as claimed in claim 1, wherein said frames have projections extending therefrom, and further comprising a panel hinged to said projections, and a printed circuit board mounted on said panel.

* * * * *